US006448771B1

(12) United States Patent
Harvey et al.

(10) Patent No.: US 6,448,771 B1
(45) Date of Patent: Sep. 10, 2002

(54) MAGNETIC RESONANCE METHOD FOR FORMING A FAST DYNAMIC IMAGE

(75) Inventors: Paul Royston Harvey; Miha Fuderer, both of Eindhoven (NL)

(73) Assignee: Koninklijke Phillips Electronics N.V., Eindhoven (NL)

( * ) Notice: Subject to any disclaimer, the term of this patent is extended or adjusted under 35 U.S.C. 154(b) by 0 days.

(21) Appl. No.: 09/918,159

(22) Filed: Jul. 30, 2001

(30) Foreign Application Priority Data

Jul. 31, 2000 (EP) .............................................. 00202728
Dec. 22, 2000 (EP) .............................................. 00204810

(51) Int. Cl.$^7$ ................................................ G01V 3/00

(52) U.S. Cl. ......................... 324/307; 324/309; 324/312

(58) Field of Search ................................ 324/307, 309, 324/312, 306, 314, 318, 322, 300; 600/410, 421, 422

(56) References Cited

U.S. PATENT DOCUMENTS 5,910,728 A * 6/1999 Sodickson .................. 324/309
6,104,943 A * 8/2000 Frederirick et al. ......... 600/410
6,326,786 B1 * 12/2001 Pruessmann et al. ....... 324/312
6,377,045 B1 * 4/2002 Van Den Brink ........... 324/307

FOREIGN PATENT DOCUMENTS

EP 0335 534 * 3/1989
WO WO 99/54746 * 10/1999

OTHER PUBLICATIONS

Heidemann et al., "Variable Density AUTO-SMASH Imaging," Apr. 1–7, 2000, p. 274.
Kyriakos et al., "Sensitivity Profiles From An Array Of Coils For Encoding And Reconstruction In Parallel (Space Rip)," Feb. 8, 2000, pp. 301–308.
Parrish et al., "Hybrid Technique For Dynamic Imaging," Jan. 7, 2000, pp. 51–55.
Tsai et al., "Reduced aliasing artifacts using variable–density k–space sampling trajectories," Mar. 2000, pp. 452–458.
Glover et al., "a robust single–shot partial sampling scheme," Jul. 1995, pp. 74–79.
Sodickson et al., "Simultaneous Acquisitions Of Spatial Harmonics (SMASH): Fast Imaging With Radiofrequency Coil Arrays," Jan. 10, 1997, pp. 591–603.

* cited by examiner

Primary Examiner—Edward Lefkowitz
Assistant Examiner—Brij B. Shrivastav
(74) Attorney, Agent, or Firm—John Vodopia

(57) ABSTRACT

A magnetic resonance method is described for forming a fast dynamic image from a plurality of signals acquired by an array of multiple sensors. The k-space is segmented into regions of different type of acquisition. In the region of a first acquisition type a first partial image is reconstructed by data of normal magnetic resonance imaging with a full set of phase encoding steps or by data of fast dynamic imaging with a number of phase encoding steps with a low reduction factor with respect to the full set thereof, and in the region of a second acquisition type a second partial image is reconstructed by data of fast dynamic imaging with a full reduction factor. The first and the second partial images are subsequently combined so as to form the full image of the scanned object.

18 Claims, 3 Drawing Sheets

MAGNETIC RESONANCE METHOD FOR FORMING A FAST DYNAMIC IMAGE

BACKGROUND OF INVENTION

The invention relates to a magnetic resonance method for forming a fast dynamic image from a plurality of signals acquired by an array of multiple sensors according to the preamble of claim 1. The invention also relates to a magnetic resonance imaging apparatus for obtaining a fast dynamic image according to the preamble of claim 17 and to a computer program product according to the preamble of claim 18.

SUMMARY OF THE INVENTION

In magnetic resonance imaging there is a general tendency towards obtaining acceptable images within shorter periods of time. For this reason the sensitivity encoding method called "SENSE" has recently been developed by the Institute of Biomedical Engineering and Medical Informations, University and ETH Zürnich, Switzerland. The SENSE method is based on an algorithm which acts directly on the image as detected by the coils of the magnetic resonance apparatus and in which subsequent encoding steps can be skipped and hence an acceleration of the signal acquisition for imaging by a factor of from two to three can be obtained. Crucial for the SENSE method is the knowledge of the sensitivity of the coils which are arranged in so-called sensitivity maps. In order to accelerate this method there are proposals to use raw sensitivity maps which can be obtained through division by either the "sum-of-squares" of the single coil references or by an optional body coil reference (see e.g. K. Pruessmann et. al. in Proc. ISMRM, 1998, abstracts pp. 579, 799, 803 and 2087).

The SENSE method is preferred for acceleration of the signal acquisition for magnetic resonance imaging resulting in an enormous reduction in operating time. However, the method can only be used properly if the coil sensitivity is exactly known. Otherwise imperfections will cause fold-over artefacts (aliasing) which lead to incorrect images. In practice the coil sensitivity cannot be estimated perfectly and will be dependent on fluctuations in time (movement of the patient, temperature influences, etc.).

Another important problem of the SENSE method is the spatially varying noise level in the resultant image. More specifically, the resultant image can have regions of extremely high noise level that are due to local "underdetermination" of the information provided by the coil patterns.

It is an object of the present invention to achieve a major reduction of the noise level across the entire image during fast dynamic imaging.

This and other objects of the invention are achieved by a method as defined in claim 1, by an apparatus as defined in claim 17 and by a computer program product as defined in claim 18.

The main aspect of the present invention is based on the idea to acquire the low spatial frequencies, i.e. the low-order k-lines, with full density by using the normal magnetic resonance imaging, and to acquire the remaining high spatial frequencies, i.e. the high-order k-lines, with reduced density, i.e. with the SENSE imaging method. In more general terms: it is proposed to have a k-space coverage that varies across k-space, the density of the acquired information at the centre being higher than for the high spatial frequency information.

An important additional advantage of the imaging with full density at the centre of k-space is that the SENSE acquisition can be reconstructed without a-priori knowledge of coil sensitivity maps. More accurate images with an improved signal-to-noise ratio can thus be made at the same rate as with the SENSE method.

BRIEF DESCRIPTION OF THE DRAWING

These and other advantages of the invention are disclosed in the dependent claims and in the following description in which an exemplified embodiment of the invention is described with respect to the accompanying drawings. Therein:

Specific numbers dedicated to elements defined with respect to a particular figure will be used consistently in all figures unless mentioned otherwise.

DESCRIPTION OF THE PREFERRED EMBODIMENTS

Figure 1:
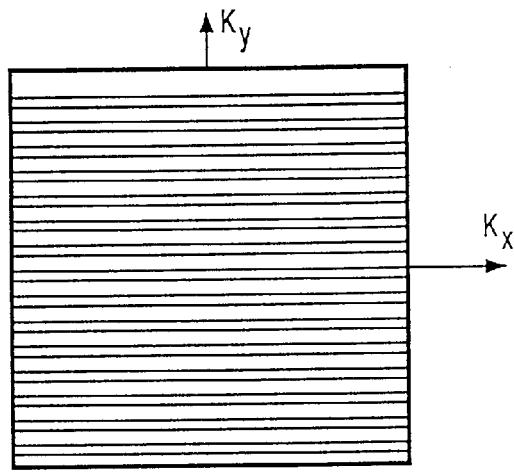
FIG. 1 shows the regular scanning of k-space according to the well-known acquisition scheme.
Figure 2:
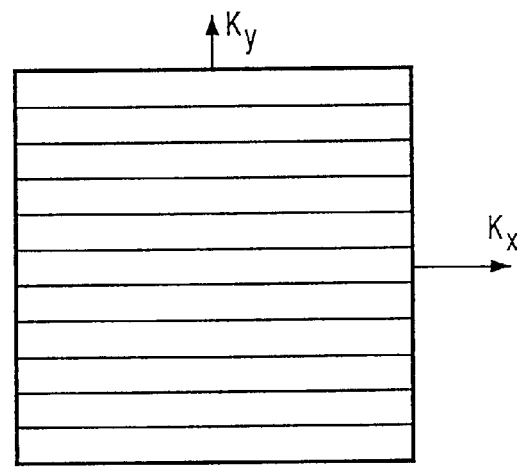
FIG. 2 shows the regular scanning according to SENSE acquisition.

FIG. 1 shows the regular acquisition scheme in conformity with the well-known normal magnetic resonance methods. FIG. 2 shows the acquisition scheme according to the SENSE method. The resultant raw images consist of N mutually overlapping strips. This situation has been measured simultaneously with M coils, whereas $M \geq N$. In fact, the actual measurement is taken by using a step in k-space that is N times too large compared to the k-space step that Nyquist would prescribe for the regular acquisition of FIG. 1. A typical value of N, also called SENSE factor, is 3, resulting in the acquisition scheme of FIG. 2; the data thereof is Fourier transformed. In effect, for each pixel of the required image there exist M equations and N unknowns which can be solved as a set of linear equations. This results in the required image according to the SENSE acquisition scheme.

The main problem of this procedure is that, locally, the set of equations can become poorly conditioned, i.e. almost singular. Since the input data or coil signals always contain noise, the ill-conditioning of the set of equations leads to an enormous increase in noise in the resultant image. Theoretically speaking, for a location where the set is completely singular the resultant noise (i.e. the noise in that region of the reconstructed image) becomes infinite. In practice this is observed as ugly "noisy patches" in the SENSE images. An additional problem is the necessity of coil-sensitivity maps which are comparatively time-consuming.

Figure 3:
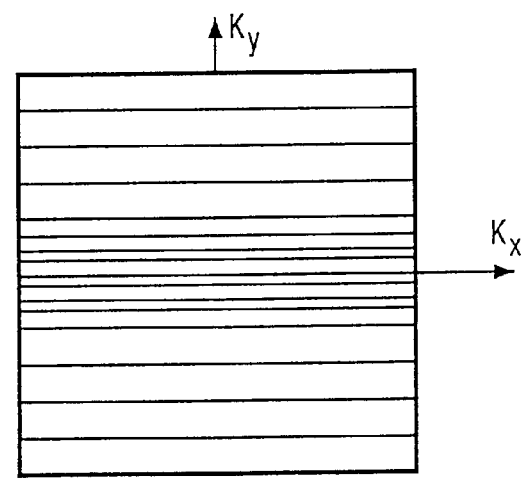
FIG. 3 shows the acquisition scheme according to the present invention.

In order to speed up the acquisition with a higher accuracy of the reconstructed image, it is now proposed to segment the k-space into regions, that is, in a basic set-up into two regions. The SENSE factor differs between different regions. Most notably it is lower for the low spatial frequencies. In the most basic set-up the SENSE-factor equals 1 (i.e. normal acquisition) for the lowest spatial frequencies. This is shown in FIG. 3.

Two subsets can be extracted from such an acquisition:
1) Data from a regular SENSE scan by dropping a number of central lines in order to get the regularity of FIG. 2, the so-called "S-data". A reconstruction according to SENSE would result in a so-called "S-image".
2) Data from a low spatial frequency scan by dropping all data outside the central region, the so-called "L-data". This can be reconstructed into a low-resolution image in a regular manner, i.e. an image with a low refreshing rate.

On the condition that the L-data has been acquired with SENSE-factor=1, that data allows the reconstruction of coil sensitivity maps. This means that a regular SENSE reconstruction of the S-data can be performed even if no pre-acquired coil-sensitivity data is available. Moreover, the L-data has been acquired with no SENSE or with a moderate SENSE-factor, e.g. 1.5. This allows the reconstruction (either by plain FFT or by SENSE) of a low-resolution image, the so-called "L-image", that can be regarded as being stable in terms of signal-to-noise ratio. The basic idea is to use the data form the L-image wherever the S-image would be exceedingly noisy. This can be implemented in different ways.

A first reconstruction set-up, the so-called "hard substitution", reconstructs both an S-image and an L-image and selects the most appropriate one of the two. The reconstruction process will "know" where this has to be done: wherever D is the determinant of the set of equations to be solved for each pixel of the image. The value of D strongly varies across over the whole image and noise problems are to be expected in those regions of the S-image where the value of D is very low. On the basis of this knowledge the simplest procedure for combination of the S-images and the L-images is that for every pixel of the resultant image the corresponding value of the S-image is selected if D exceeds a predetermined threshold. Otherwise the corresponding value of the L-image is selected. A slight imperfection of this combination technique may be the adverse visual effect of "cut lines" in the image, separating low-noise regions from high-resolution regions, i.e. regions with a high refreshing rate of the image.

A second reconstruction set-up is the so-called "soft combination" which is a version of the first one: the resultant image I is combined by the following equation:

$$I = f(D) \cdot L + (1 - f(D)) \cdot S$$

where $f(D)$ is a function that approaches 1 for low values of the determinant D and approaches 0 for high D values. L and S are the values of the L-images and the S-images, respectively.

A third reconstruction method is the so-called "algebraic combination", which can be described as follows: add to the set of equations, i.e. the basis of the reconstruction of the S-image, an additional set of equations expressing that the resultant image pixel values are somewhat close to the L-values of the L-image. The basis for the algebraic combination can be explained in matrix calculus as follows:

The regular SENSE reconstruction consists essentially in solving the following set of equations:

$$S \cdot \vec{p} = \vec{m}$$

where S is the sensitivity matrix, so $S_{ij}$ is the sensitivity of coil i on pixel position j. It is an M by N matrix, where M is the number of coils, i.e. the number of equations, and N the SENSE-factor, or the number of signals folded on each other, i.e. the number of unknowns. m ("measured value") is a vector of length M: the folded information for every coil; p ("pixel") is a vector or set of N unfolded pixels.

The least-squares inversion of the problem can be formulated as $$\vec{p} = (S^h \cdot \Psi^{-1} \cdot S)^{-1} \cdot S^h \cdot \Psi^{-1} \cdot \vec{m}$$

where "h" stands for hermitian transposed and $\Psi$ denotes the M×M noise covariance matrix. So far for regular SENSE.

Now we add an additional set of equations:

$$\vec{p} = \vec{m}_L$$

where $\vec{m}_L$ is the corresponding pixel in the L-image. The combined set of equations can be written as $$\begin{bmatrix} S \\ I_N \end{bmatrix} \cdot \vec{p} = \begin{bmatrix} \vec{m} \\ \vec{m}_L \end{bmatrix}$$

where $I_N$ stands for N×N identity matrix. The solution thereof is given by $$\vec{p} = \left( \begin{bmatrix} S \\ I_N \end{bmatrix} \cdot \Psi_{ext}^{-1} \cdot \begin{bmatrix} S \\ I_N \end{bmatrix} \right)^{-1} \cdot \begin{bmatrix} S \\ I_N \end{bmatrix}^h \cdot \Psi_{ext}^{-1} \cdot \begin{bmatrix} \vec{m} \\ \vec{m}_L \end{bmatrix}$$

The "extended noise covariance matrix $\Psi_{ext}$ has to be defined as $$\Psi_{ext} = \begin{bmatrix} \Psi & 0 \\ 0 & R \end{bmatrix}$$

In this expression R is a diagonal "regularisation matrix" of size N×N. The diagonal element $R_{ii}$ thereof has to be filled in as the variance of the expected noise in the image times a certain factor (which steers the trade-off between "too noisy" and "too much resolution loss").

The solution of the combined set of equations simplifies to $$\vec{p} = (S^h \cdot \Psi^{-1} \cdot S + R^{-1})^{-1} \cdot (S^h \cdot \Psi^{-1} \cdot \vec{m} + R^{-1} \cdot \vec{m}_L)$$

This is also a kind of "weighted addition": if the determinant of S dominates over $R^{-1}$ (which is, in effect, some constant), the solution approximates the "regular SENSE" reconstruction $\vec{p} = (S^h \cdot \Psi^{-1} \cdot S)^{-1} \cdot (S^h \cdot \Psi^{-1} \cdot \vec{m})$; if the determinant approaches zero, then $\vec{p} \approx (R^{-1})^{-1} \cdot (R^{-1} \cdot \vec{m}_L) = \vec{m}_L$ The fourth reconstruction scheme is the so-called "full usage". In this scheme any of the previous reconstruction methods can be combined with the following procedure:
reconstruct a combined SENSE-image according to the previous three combination methods,
make an inverse Fourier transformation thereof in the SENSE direction(s),
substitute the central part of the data thereof with the corresponding form of the L-data (note that this "hard substitution" can be replaced by a weighing function which, depending on $k_y$, gradually changes from "giving full weight to the L-data" to "giving full weight to the combined SENSE data")
again make a Fourier transformation into the image domain.

A further option for the above-mentioned reconstruction methods is filtering of the L-data before FFT by multiplying it with a tapering function, e.g. a Riesz function. In addition the L-data can be used for the reconstruction of the coil-sensitivity maps. In regular SENSE the coil-sensitivity maps are usually derived by comparison of coil element data with a body-coil acquisition. However, according to the above methods the body-coil data is not or not necessarily available. It is already proposed to take the root-sum-of-squares (RSSQ) combination of the coil element data instead. That RSSQ is devoid of phase information, so differences with respect to pixels of the L-image may be introduced. Therefore it is suggested to take a plain sum of the L-data over the coil elements; this will give a more appropriate result. The plain sum can be taken after a very basic phase correction, e.g. correcting L-data of every coil element to have zero average phase.

SENSE can also be applied in three-dimensional acquisitions. That can be done by a reduced k-line density in $k_y$ or $k_z$ or both directions, as long as the product of the reduction factors does not exceed the number of coils. For the L-data region of k-space, i.e. the region of low spatial frequencies acquired with a low SENSE-factor, in principle all combinations of limitations are possible: limitations thereof in $k_y$ or in $k_z$ or in both directions. The last option is only of interest if there is also a SENSE-reduction in both dimensions. The low SENSE-factor region can then have, for example, a square, circular or rectangular shape. In the case of dynamic scans is may be that it is not strictly necessary to acquire the L-data on every frame: in favourable circumstances that data is only used for rather limited image areas. Therefore, the L-data of "old" time frames, e.g. of the first dynamic scan, may also suffice for subsequent images.

Although the present method is described with respect to SENSE, it can also be used for the so-called SMASH acquisition as described in detail in Magnetic Resonance in Medicine, 38, pages 591–603 (1997). The main difference with SENSE is that SMASH manipulates the image in the Fourier-domain or k-space.

Figure 4:
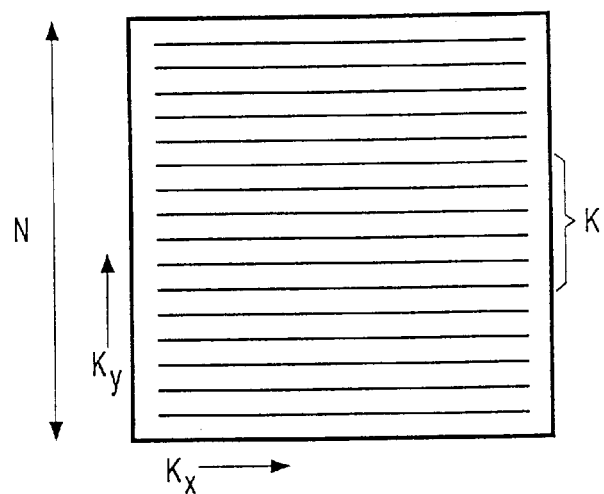
FIG. 4 shows a regular keyhole MR imaging acquisition.

FIG. 4 illustrates the regular keyhole MR imaging which is characterized by the data acquisition scheme in which first a full resolution image acquisition of all encoding steps N is performed and then the central k-space lines are continuously updated in what is called a keyhole acquisition. After each update a complete image is reconstructed using the existing high frequency k-space data from the full resolution scan. In this example K lines around the k-space center are updated continuously. This kind of technique is used for imaging contrast changes at a fast rate.

Figure 5:
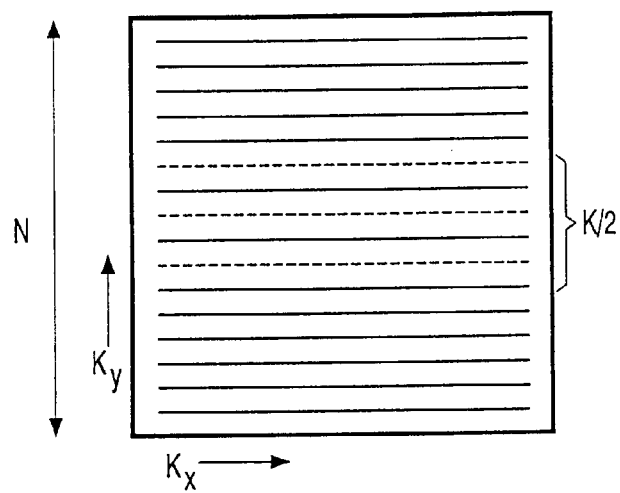
FIG. 5 shows a first example for the use of the SENSE technique for keyhole imaging.

FIG. 5 shows a first example for the use of the SENSE technique for keyhole imaging. Instead of a regular MR scan in the k-space center region, a SENSE scan with a factor 2 is applied to generate data for the keyhole region. Half the number of encodings K/2 is now acquired in comparison with the regular keyhole acquisition and the SENSE reconstruction method generates the missing lines. In this manner the temporal resolution of the keyhole technique is increased by a factor of 2.

Figure 6:
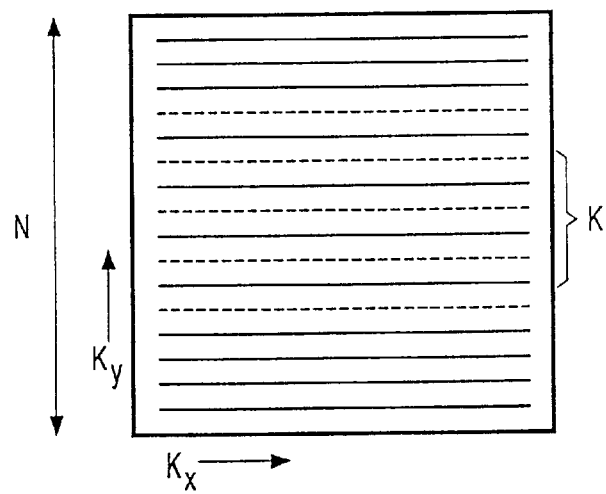
FIG. 6 shows a second example for the use of the SENSE technique for keyhole imaging.

Furthermore, FIG. 6 shows a second example for the use of the SENSE technique for keyhole imaging. K lines are now acquired with a SENSE factor of 2 for each keyhole acquisition, with the effect that a larger keyhole region is covered in the same time as required for the acquisition method according FIG. 5. The advantage of this approach is an increased robustness of the keyhole technique which results from a larger coverage of k-space during the keyhole acquisition.

As mentioned with respect to the acquisition schemes according to FIGS. 2 and 3, the general principle is compatible with all other SENSE and keyhole methods in two and three dimensions. Further implementations include the combination of SENSE imaging for the fall acquisition with a different SENSE factor compared with the keyhole SENSE acquisition, and the combination of SENSE imaging in two perpendicular directions ($k_y$, $k_z$) in order to enable 3D keyhole imaging with an improved time resolution.

Figure 7:
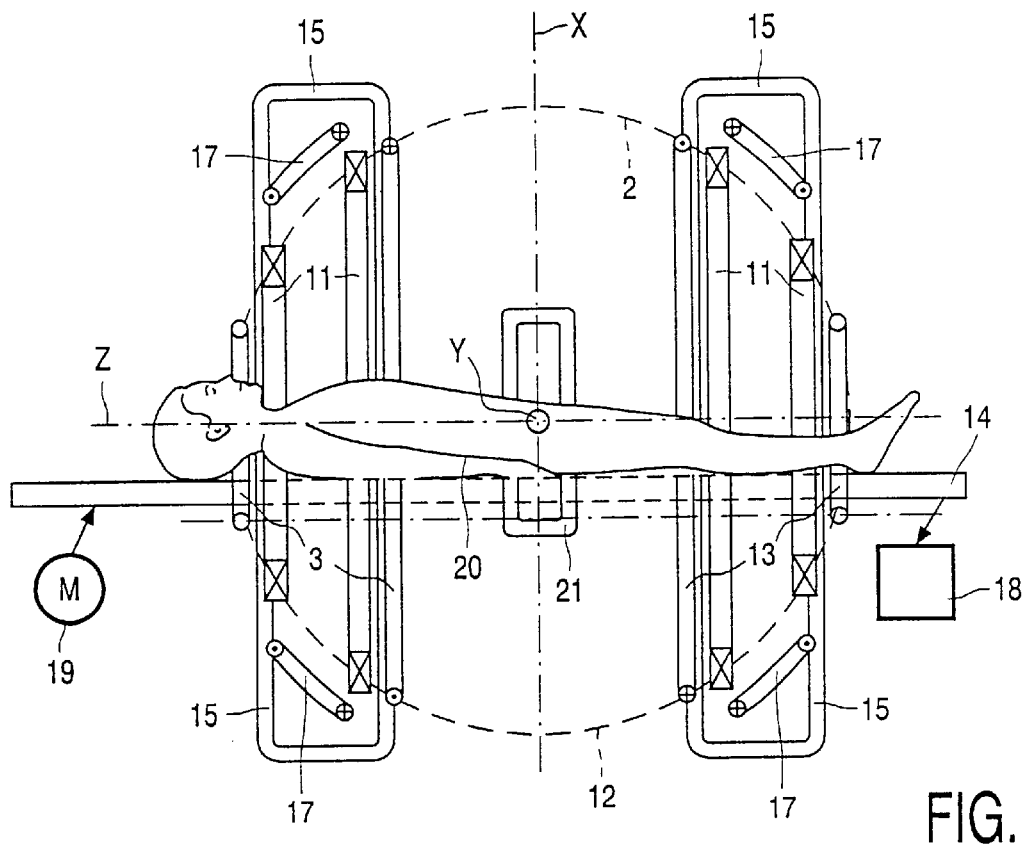
FIG. 7 shows an apparatus for carrying out the method in accordance with the present invention.

The apparatus shown in FIG. 7 is an MR apparatus which comprises a system of four coils 11 for generating a steady, uniform magnetic field whose strength is of the order of magnitude of from some tenths of Tesla to some Tesla. The coils 11, being concentrically arranged relative to the z axis, may be provided on a spherical surface 12. The patient 20 to be examined is arranged on a table 14 which is positioned inside these coils. In order to produce a magnetic field which extends in the z direction and linearly varies in this direction (which field is also referred to hereinafter as the gradient field), four coils 13 are provided on the spherical surface 12. Also present are four coils 17 which generate a gradient field which also extends (vertically) in the x direction. A magnetic gradient field extending in the z direction and having a gradient in the y direction (perpendicularly to the plane of the drawing of FIG. 7) is generated by four coils 15 which may be identical to the coils 17 but are arranged so as to be offset 90° in space with respect thereto. Only two of these four coils are shown in FIG. 7.

Because each of the three coil systems 13, 15, and 17 for generating the magnetic gradient fields is symmetrically arranged relative to the spherical surface, the field strength at the centre of the sphere is determined exclusively by the steady, uniform magnetic field of the coil 11. Also provided is an RF coil 21 which generates an essentially uniform RF magnetic field which extends perpendicularly to the direction of the steady, uniform magnetic field (i.e. perpendicularly to the z direction). The RF coil receives an RF modulated current from an RF generator during each RF pulse The RF coil 21 can also be used for receiving the spin resonance signals generated in the examination zone.

Figure 8:
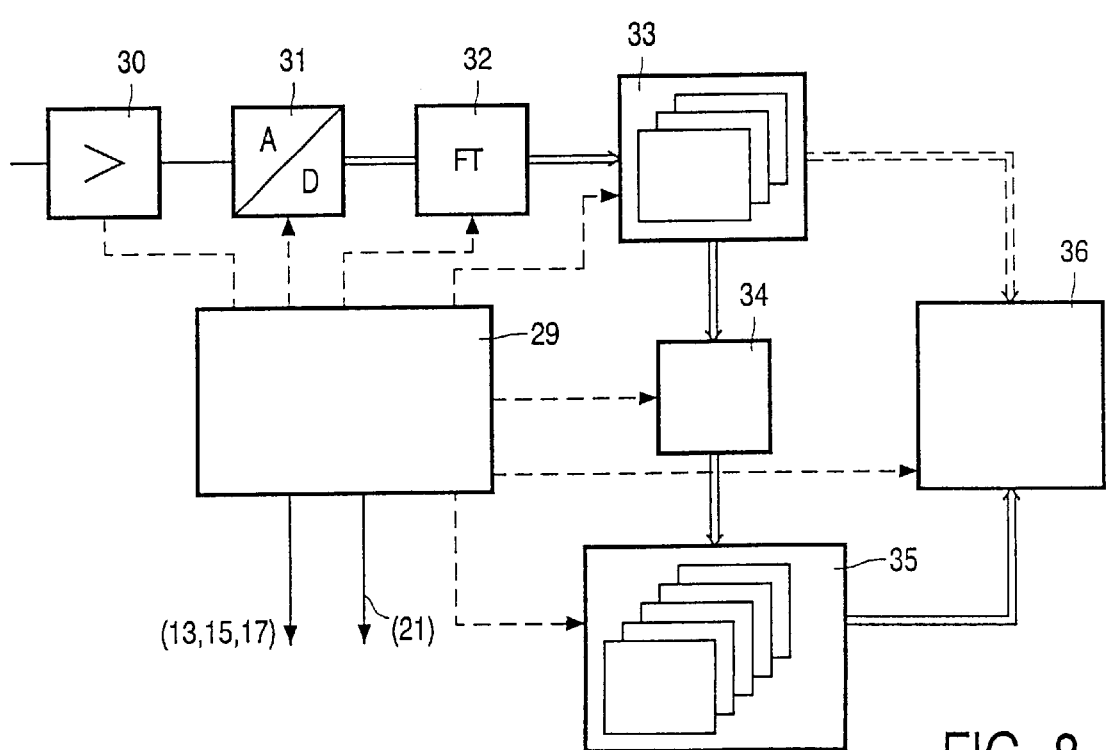
FIG. 8 shows a circuit diagram of the apparatus as shown in FIG. 1.

As is shown in FIG. 8, the MR signals received in the MR apparatus are amplified by a unit 30 and transposed in the baseband. The analog signal thus obtained is converted into a sequence of digital values by an analog-to-digital converter 31. The analog-to-digital converter 31 is controlled by a control unit 29 so that it generates digital data words only during the read-out phase. The analog-to-digital converter 31 is succeeded by a Fourier transformation unit 32 which performs a one-dimensional Fourier transformation over the sequence of sampling values obtained by digitization of an MR signal, execution being so fast that the Fourier transformation is terminated before the next MR signal is received.

The raw data thus produced by Fourier transformation is written into a memory 33 whose storage capacity suffices for the storage of several sets of raw data. From these sets of raw data a composition unit 34 generates a composite image in the described manner; this composite image is stored in a memory 35 whose storage capacity suffices for the storage of a large number of successive composite images 10. These sets of data are calculated for different instants, the spacing of which is preferably small in comparison with the measurement period required for the acquisition of a set of data. A reconstruction unit 36, performing a composition of the subsequent images, produces MR images from the sets of data thus acquired, said MR images being stored. The MR images represent the examination zone at the predetermined instants. The series of the MR images thus obtained from the data suitably reproduces the dynamic processes in the examination zone.

The units 30 to 36 are controlled by the control unit 29. As denoted by the downwards pointing arrows, the control unit also imposes the variation in time of the currents in the gradient coil systems 13, 15 and 17 as well as the central frequency, the bandwidth and the envelope of the RF pulses generated by the RF coil 21. The memories 33 and 35 as well as the MR image memory (not shown) in the reconstruction unit 36 can be realized by way of a single memory of adequate capacity. The Fourier transformation unit 32, the composition unit 34 and the reconstruction unit 36 can be realized by way of a data processor well-suited for running a computer program according the above-mentioned method.

What is claimed is:

1. A magnetic resonance method for forming a fast dynamic image from a plurality of signals acquired by an array of multiple sensors, whereas prior to imaging a sensitivity map of each of the sensors is provided, at least two adjacent sensors record signals originating from the same imaging position, which signals are weighted with the sensitivity factor of the respective sensor at the respective imaging position, and the image intensity is calculated from the signals measured by the different sensors, and wherein the number of phase encoding steps is reduced with respect to the full set thereof, characterized in that k-space is segmented into regions of different acquisition, in the region of a first acquisition type there being acquired data of normal magnetic resonance imaging with a full set of phase encoding steps, or data of fast dynamic imaging with a number of phase encoding steps with a low reduction factor with respect to the full set thereof, for a first partial image whereas in the region of a second acquisition type data of fast dynamic imaging with a full reduction factor is acquired for a second partial image, the first and the second partial images forming the full image of the object to be imaged.

2. A magnetic resonance method according to claim 1, characterized in that the data of the first acquisition type will be reconstructed into the first partial image and the data of the second acquisition type will be reconstructed into the second partial image.

3. A magnetic resonance method according to claim 1, characterized in that the data for fast dynamic imaging is acquired simultaneously from spatial harmonics on several adjacent trajectories in k-space, which data will be reconstructed into an image.

4. A magnetic resonance method according to claim 1, characterized in that the first partial image is reconstructed from data of the first acquisition type and the second partial image is reconstructed from data of the second acquisition type.

5. A magnetic resonance method according to claim 1, characterized in that acquisition in the first and second regions is realized by regularly scanning over the full object and dropping the data outside the particular acquisition region.

6. A magnetic resonance method according to claim 4, characterized in that the first acquisition region is the central region of k-space and the second acquisition region is the outer k-region.

7. A magnetic resonance method according to claim 4, characterized in that the first acquisition region is the outer k-region and the second acquisition region is the central region of k-space.

8. A magnetic resonance method according to claim 7, characterized in that the acquisition in the outer k-region is carried out only once for several dynamic images.

9. A magnetic resonance method according to claim 8, characterized in that the second acquisition is carried out at the same region as for keyhole acquisition.

10. A magnetic resonance method according to claim 1, characterized in that the first acquisition region and the second acquisition region overlap to a predetermined extent.

11. A magnetic resonance method according to claim 4, characterized in that the determinant of the set of equations for every pixel of the resultant image is computed and that the image of the pixel is selected from data of the second region if the determinant exceeds a predetermined threshold value and is otherwise selected from the data of the first region.

12. A magnetic resonance method according to claim 4, characterized in that the resultant image is combined as $$I = f(D)*L + (1-f(D))*S$$

where:

I=the resultant image

D=determinant of the equations for every pixel $f(D)$=function that approaches 1 for low values of D and approaches to 0 for high values of D L=data of the first region S=data of the second region.

13. A magnetic resonance method according to claim 1, characterized in that the data of the first acquisition method are filtered by multiplying with a tapering function, especially a Riesz-function or the like, before fast Fourier transformation.

14. A magnetic resonance method according to claim 1, characterized in that the sensitivity map is derived from a combination of the root sum of squares of the data from each of the sensors.

15. A magnetic resonance method according to claim 1, characterized in that the sensitivity map is derived from the sum of data of the first acquisition method from each of the sensors.

16. A method according to claim 15, characterized in that the data of each of the sensors are corrected in phase, especially by correction to an average phase zero.

17. A magnetic resonance imaging apparatus for obtaining a fast dynamic image from a plurality of signals, comprising:

an array of multiple sensors for recording signals, means for scanning the object along phase encoding trajectories, control means for skipping part of the phase encoding trajectories, calculating means for reconstructing an image from signals recorded by sensors of different spatial positions with respect to the object to be imaged in order to obtain a fast dynamic image, characterized in that there are provided:

means for segmenting k-space into regions of different type of acquisition, means for reconstructing a first partial image in the region of a first acquisition type from data of normal magnetic resonance imaging with a full set of phase encoding steps or from data of fast dynamic imaging with a number of phase encoding steps being with a low reduction factor with respect to the full set thereof means for reconstructing a second partial image in the region of a second acquisition type from data of fast dynamic imaging with a full reduction factor, and means for forming a full image of the scanned object from the first and the second partial images.

18. A computer program product stored on a computer usable medium for forming a fast dynamic image by means of the magnetic resonance method, comprising a computer readable program means for causing the computer to control the execution of:
- a recording procedure for signals from an array of multiple sensors
- a procedure for scanning the object along phase encoding trajectories,
- a control procedure for skipping part of the phase encoding trajectories,
- a calculation procedure for reconstructing image from signals recorded by sensors of different spatial positions with respect to the object to be imaged in order to obtain a fast dynamic image, characterized in that there are provided:
- a procedure for segmenting k-space into regions of different type of acquisition,
- a reconstruction procedure for forming a first partial image in the region of a first acquisition type from data of normal magnetic resonance imaging with a full set of phase encoding steps or from data of fast dynamic imaging with a number of phase encoding steps with a low reduction factor with respect to the full set thereof,
- a reconstruction procedure for forming a second partial image in the region of a second acquisition type from data of fast dynamic imaging with a full reduction factor, and
- a procedure for forming a full image of the scanned object from the first and the second partial images.

* * * * *